(12) United States Patent
Swift et al.

(10) Patent No.: US 7,518,376 B2
(45) Date of Patent: Apr. 14, 2009

(54) ELECTRIC FIELD PROBE

(75) Inventors: Joseph A. Swift, Ontario, NY (US);
Tyco Skinner, Boston, MA (US);
Michael F. Zona, Holley, NY (US)

(73) Assignee: Xerox Corporation, Norwalk, CT (US)

( * ) Notice: Subject to any disclaimer, the term of this patent is extended or adjusted under 35 U.S.C. 154(b) by 251 days.

(21) Appl. No.: 11/707,355

(22) Filed: Feb. 16, 2007

(65) Prior Publication Data

US 2008/0197853 A1 Aug. 21, 2008

(51) Int. Cl.
*G01R 29/12* (2006.01)
*G01R 23/16* (2006.01)

(52) U.S. Cl. .................. 324/457; 324/559; 324/96; 250/306

(58) Field of Classification Search .............. 324/96, 324/457, 559; 250/506, 306
See application file for complete search history.

(56) References Cited

U.S. PATENT DOCUMENTS

| 2,297,691 | A |  | 10/1942 | Carlson |
|---|---|---|---|---|
| 5,781,003 | A | * | 7/1998 | Kondo .......................... 324/96 |
| 2006/0087324 | A1 |  | 4/2006 | Berggren et al. |
| 2007/0194225 | A1 | * | 8/2007 | Zorn ........................... 250/306 |

FOREIGN PATENT DOCUMENTS

EP 0200300 2/1986

* cited by examiner

*Primary Examiner*—Vincent Q Nguyen
(74) *Attorney, Agent, or Firm*—James J. Ralabate

(57) ABSTRACT

This is an electronic scanning probe, preferably made up of at least two sensing elements, each sensing element substantially surrounded by reference electrodes. These sensing elements are separated at a distance that causes little or no cross-interference to take place between these sensing elements when positioned in concert with a surface of interest. Ideally, this probe is used in electrostatic marking systems where an electrostatic charge is placed onto a receiving surface.

6 Claims, 4 Drawing Sheets

ELECTRIC FIELD PROBE

CROSS REFERENCE

Illustrated and disclosed in a co-pending application owned by the present assignee is an application relating to electronic probes as used with a controller and charger in an electrostatic marking process. The application based upon ID 20061030 is filed in the U.S. Patent and Trademark Office on the same date as the present application. The disclosure of ID 20061030 is totally incorporated herein by reference.

This invention relates generally to an electronic field probe and more particularly to a scanning field probe that detects low intensity signals and small variations in the subject signal. Optionally, it uses multiple sensing elements which may be contained in a single mounting.

BACKGROUND

There are many occasions where the measurement of the surface potential or surface voltage, surface potential distribution, polarity or density of charge on a surface or even measurement of current density emitted by a charge source is desirable. Also, there are situations where quantification of the efficiency of electrostatic charging devices is needed. This invention deals with a probe that efficiently measures, for example, the charge density on a charged surface at a resolution level of interest to the analyst which can fall in the sub-micron range.

While the present probe can be effectively used with a plurality of different charged surfaces, for clarity and understanding, it will be described when used in an electrostatic marking system, such as electrophotography.

Electrostatography is best exemplified by the process of xerography as first described in U.S. Pat. No. 2,297,691 to C. F. Carlson. In this process, the photoconductor is first provided with a uniform electrostatic charge over its surface and is then exposed to image-wise activating electromagnetic radiation that dissipates the charge in illuminated areas of the photoconductor while the charge in the non-illuminated areas is retained thereby forming a latent electrostatic image. This latent electrostatic image is then developed or made visible by the deposition of finely-divided electroscopic marking particles referred to in the art as "toner." The toner will normally be attracted to those areas of the layer which retain a charge, thereby forming a toner image corresponding to the latent electrostatic image. This powder image may then be transferred to a support surface, such as paper. The transferred image may subsequently be permanently affixed to the support by heat fusing. Instead of forming a latent image by uniformly charging the photoconductive layer and then exposing the layer to a light and shadow image, a latent image may be formed by charging an insulating or photoconductive insulating member in image configuration by suitable process, for example by ion writing, as described in U.S. Pat. No. 5,257,045 issued to Bergen, et. al. and also known in the art as ionography. The powder image may be fixed to the imaging member if elimination of the powder image transfer step is desired. Alternatively, the toned image can be transferred onto and off from an intermediate surface, such as an intermediate transfer belt's surface, before transfer and fixing to final desired media.

Several methods are known for applying an electrostatic charge to the large area of a photosensitive member such as the use of ion generating devices such as single corona-charging structures such as metal wires, saw tooth shaped pins, insulator-coated wire assemblies, and biased charging rollers or belts. In recent development of high speed xerographic reproduction machines where copiers and/or printers can produce output at rates in excess of three thousand copies per hour, and where precise management of charge upon a plurality of surfaces is required, such as on photosensitive imaging surfaces, intermediate transfer belts and related rolls, fusing and pressure rolls and belts, as well as on most moving surfaces in an electrographic printer, the need for uniform and reliable charging and charge controlling systems are needed in order to provide optimum image quality as well as reliable printer operation. Also, with the advent of color copiers, printers, and multifunctional devices (that copy/print/fax) where several corona-charging stations are needed, the requirement for dependable means for depositing a uniform electrostatic charge is essential. With the advent and progress of contemporary digital half-toning algorithms, photoreceptor charge uniformity is more important than ever to ensure good halftone quality of the printer's output.

Generally, in electrostatographic or electrostatic copy processes, a number of corotrons or dicorotrons are used at various stations around the photoreceptor. For example, the dicorotrons are used at the station that places the initial uniform charge on the photoreceptor, at a transfer or pre-transfer station, at a cleaning or pre-cleaning station, at an erase station, etc. In today's high speed copiers where reliable and uniform charging of numerous, high speed moving surfaces is required, it is important that all corotrons (or dicorotrons) are in consistent, perfect working order since corotron malfunction or contamination can easily create streaks and non-uniformities in the output of the xerographic engines in which they are used. Some high speed engines, including color copiers and printers, use several dicorotron units, and, may include as many as sixteen corotron or dicorotron units in engines that employ image-on-image technology like the Xerox iGen3 color press. Maintaining each corotron unit in perfect working order is essential to the proper functioning of these complex, high speed color engines. It is common to use one or several corona-generating device(s) ("corotron" or "dicorotron") for depositing the electrostatic charges at the above-noted stations. A reliable, compact, and low cost probe for quantifying the uniformity of these xerographic charging devices is needed.

Further, there are instances where it is important to measure and monitor the macro- and micro-uniformity of the output of xerographic charging devices, and other instances where measurement of such parameters as the maximum, the minimum, local variations, and/or the mean sample charge density on large smooth, or irregular, or toned surfaces may be required. Since the difference between closely spaced charges is often a determinant of the desired surface state, which is generally beyond the capability of contemporary measurement systems, there exists a need to increase the detection resolution to a level of at least the size of the typical toner particles (5 to 10 microns) and preferable in the range of about 100 nanometer (nm) resolution or even 10 nm or lower. In so doing this high resolution sensing capability would enable direct mapping of microscopic charge domains including closely-spaced, non-uniform charges such as "hot" or "cold" spots in or on a plurality of surfaces as well as directly from the charging devices themselves such as the charge emissions from nano-structured charging devices such as the ones described in US Patent Application Publication 20060280524, filed on Dec. 14, 2006 by Hays, et. al. In addition, there is a need to make the devices more efficient and reliable, for example, to enable simultaneous maps of more than one microscopic area within a large field on a photoconductive or other surface of interest that must operate in the open environment. Similarly, there is a need to make the sensing devices small or compact in size, low in cost, safe to use, and easy to manufacture.

SUMMARY

Provided herein is a high resolution, multifunctional scanning field probe that uses in one embodiment at least one miniature sensing element contained in close proximity to a reference plane. When positioned adjoining, but not in direct contact with, a charge containing surface, an output signal proportionate to the local charge can be produced. The "local" charge is defined herein as the area of charge or area of mixed charges that resides immediately in view of the sensor. Normally, it is precise quantification of the local charge that represents a major challenge. Charges that lay outside of this area are defined as "far-field" charges, which can be a source of noise to the measurement and may not be of particular interest to the analyst. Optionally multiple sensing elements with suitable reference planes can be closely aligned to each other within a single mounting. The cross sectional dimension of the sensing elements can be large or micron sized, or preferably sub-micron sized to achieve the greatest resolution capabilities. By "micron sized" is meant within a range of about 1 to about 1000 microns. By "sub-micron sized" is meant within a range of less than 1 micron to less than about 1 nanometer (nm) Pairings of sensing elements in one embodiment can be aligned and moved in tandem and in precisely the same path during scans of the sample of interest. Alternately, pairs of sensing elements can be positioned in a stationary manner to observe two side-by-side areas of a large area sample, which may be stationary or moving. The output signals from each element or from pairings of two or more elements are processed by a variety of ways to enable custom data flows, sets, and analyses. For example, each element of a pair of sensing elements or sensors can be coupled to a suitable operational differential amplifier programmed to exercise a differential algorithm and thereby produce a single output signal that represents a combination of positional and/or amplitudinal parameters of interest. The output of the differential comparator electronic device can be amplified by a solid state op amp and filtered if required to produce the level and quality of signal as needed to be displayed on a contemporary meter device, such as an electrometer. The solid state operational amplifier may be extremely small in size and mounted directly within the same mounting as the sensors thereby creating a compact, integrated assembly. Any suitable electrometer may be used with the present probe, such as those manufactured by Keithly Instruments of Cleveland Ohio, including their 610c and 6517 series electrometers. Appropriate voltmeters, ammeters and any suitable coulomb (charge) meter depending upon the design and details of the measurement circuit may be used. Since both sensors of a pair measure the same target in close time and spatial sequence, the relative portrayal of any rapidly changing charge and/or topography features are amplified, and, any noise detected by each of the sensors can be eliminated from the resultant output by the signal differentiation function thereby improving signal to noise and detection capability. Further amplification and filtration of the complex output signal may be performed depending upon the requirements of the application. The invention herein is that the probe elements can be made as small as is needed and coupled with the use of appropriate signal differentiation/amplification/filtration, and in so doing one can obtain the desired signal quality and resolution which falls in the range of about 1 to 500 nA/sq. cm. or greater. Further, some, or all of the signal processing electronics can be integrated directly into the package containing the sensors thereby forming a robust, integrated assembly that is compact, efficient to manufacture, and low in cost. The purpose of the references electrodes is to effectively establish a reference field enveloping each sensing element which essentially isolates the element from unwanted stray potentials that can interfere with the measurement. The reference electrode can be configured into any suitable shape which may include a round, circular, square, or rectangular tube, pipe, or shell (which can be defined as a portion of the circumference of a pipe or tube). Alternately it can comprise one or more parallel running, regular- or irregular-shaped, conductive or partially conducting lines or rails. The reference electrodes also define the area in which the sensing element acquires its signal and effectively focuses the sensor on the precise "local" area. Typically the reference electrodes are connected to ground or alternately, depending upon the requirements, can be biased with a suitable dc, ac, or mixed ac-dc bias.

In one embodiment of the probe of this invention two 10 micrometer sensing elements, created by the circular-shaped tips of two wire electrodes, are coupled at one end to larger 30 micrometer tungsten wires that are used as short hook-up leads. These sensing elements are assembled in close planar alignment and held rigidly within a multilayer sandwich structure that comprises the high resolution probe. The outermost layers of the sandwich are made up of any suitable conductive plate material, in this embodiment thin aluminum sheets upon which a thin layer of a suitable dielectric film having a pressure sensitive adhesive (PSA) on one side, known as Kapton® adhesive tape, is layered. Kapton tape is a product of the DuPont Company, Circleville, Ohio, 43113. The sensing elements are then adhesively bound using the PSA layered film to each of the inside surfaces of the conductive plates where it thereby solidifies the multiple layers into a rigid unit probe. Additional manufacturing details will be discussed in reference to the drawings.

In measuring a small area electric field in one embodiment a circular, miniature field probe of at about 5 microns in diameter is provided. The probe is electrically isolated from a surrounding metal, tubular-shaped reference electrode which is connected to a common ground and serves as a shield thereby effectively defining the local area that is sensed by the sensing element. It is used with a high precision electrometer capable of measuring currents in the nano- and pico-amp range that is connected between the isolated sensing electrode and ground. The probe is integrated into an x-y positional scanning mechanism to precisely move the electrode over the charged surface of a device under test (DUT) and thus measures the surface potential or charge density from the surface of interest. The probe of this invention comprises at least one and preferably two measurement electrodes (sensing elements) and a reference electrode for each sensing element. Depending upon the design and complexity of the desired sensor, the number of reference electrodes is at least one, but may be more. In general there must be sufficient reference electrodes to encircle or shield each measurement electrode. In addition there must, in general, be provided a suitable insulating media that fills the gap between sensing and reference electrodes. The insulating media may be any suitable dielectric, or low loss, material including air, insulating plastics and polymers, ceramics, and the like. A single large reference electrode such as a conductive plate may be configured to accommodate several measurement electrodes. The reference electrode in one embodiment can be in the form of a pipe which completely surrounds the measurement electrode(s) or the reference electrode in another embodiment can be in the form of flat plates which are configured to substantially surround more than one measurement electrode. Alternately, the reference electrode can be configured from two or more continuous running shells which resemble sectors obtained from the length of a pipe that is dissected along its length. The shell segments can be assembled with a suitable insulating layer to envelop and provide an effective shield to the sensing element. If the sensing element and related assembly is prepared using a thin, metal layer deposited upon a suitable substrate member such as upon a circuit board, one or more reference elements can be deposited from similar metal by similar process to lay parallel to the length of the sensing element and separated by a suitable distance. To minimize or eliminate cross talk between measurement electrodes, the distance between each sensing element or measurement electrode must be, in general, at least greater than the width dimension, or diameter if circular, of the individual measurement electrodes and preferably 2 to 10 times the width or diameter of the measurement electrode. In practice, the distance between any two sensing elements can be any suitable distance that assures that no significant cross interference or electrical shorting takes place between these sensing elements. Important to embodiments of this invention are: a. the size of and distance between the sensing element(s) and the distance between sensing and reference electrode(s) b. that the gap between sensing and reference element(s) contain a suitable insulating media, c. each sensing element or measuring electrode be at least substantially (for example, 80%) surrounded by a reference electrode (in the case of a tubular reference electrode 100% of the measuring electrode would be surrounded) and d. at least one sensing element is used and e. for every sensing element there is a sufficient reference electrode having a ground or suitable bias applied thereto. Thus, there is always the same relationship of reference electrodes to measurement electrodes or, in other words, the area of the reference electrode(s) is sufficient to effectively encircle, shield, and isolate the individual sensor electrodes.

In an electrostatic marking system, streaks, spots, uneven development and other image flaws can be traced in many instances to uneven, contaminated, or faulty charging mechanisms and/or to defects, imperfections, or contamination to the electrostatic charge layers on the DUT. The field sensing probes of this invention can easily and effectively identify these flaws by the use of the present probe suitably connected to an electrometer. The sensing elements or measurement electrodes in one embodiment can be made from small, viz 2 to 8 micron diameter, carbon fibers that have been nickel coated over the entire outer surface and can be electromechanically connected (or soldered) to a larger support wire, such as a 30 micron diameter tungsten wire which enables robust connection to a measurement circuit which can include an electrometer. A suitable shielding of the interconnection wires can be configured from suitable insulating interfacial layer and outermost conductor sleeve to envelop the interconnecting, hook up wires. The reference electrodes can be made from any conductive substances, including conductive metal plates, films, foils, tubes, or pipes.

The size and material of each component of this probe can vary depending on the requirements of the device DUT under test. The present invention can be used to ensure that a charge device (such as corotron) is providing acceptable charging uniformity before putting the device into the final xerographic assembly which may be a customer replaceable unit (CRU). This avoids the necessity of print testing the cartridge in a functioning printer before shipping the CRU to a customer. Also, CRU remanufacturing companies may use this probe during development of replacement components for OEM charging cartridges to ensure equivalent performance to the OEM components or to an established standard. In addition, the compact size of the invention allows for the installation within any particular xerographic engine. In this way, the probe can be used at various intervals during machine's operations to monitor the performance of the machine's various functions.

Given in one embodiment that two identical sensing elements are mounted in a co-planar arrangement on an integrated scanning probe having the aforementioned reference electrodes which are then scanned across a uniformly charged surface, two essentially identical output signals representative of the local area fields sensed by each sensing element can be extracted by the electronic circuit and meter. This unique arrangement of elements presents at least two opportunities for signal processing, display, or assessment. For example, should a malfunction occur in one of the signals for any reason, the experimental quality would not be compromised because at least one usable and reliable signal would be generated. Alternatively, in the case where both signals are available and reliable, insights into the spatial or temporal difference between the signals can be extracted. Alternately, the signal from one of the sensing elements upon acquiring its signal can be used as a fed to control a bias on the second sensor's measurement element or reference element. The second element in this case could precisely mirror the general level of the potential or charge on a subject surface and could efficiently detect very small variations in the local area signal in contrast to the general area condition. In another embodiment, use of an extremely small, circular sensing element such as embodied by a single-walled, or multi-walled carbon, boron nitride, or other suitable conductive nanotube (CNT), nanorod, nanodot, or nanowire is envisioned. The CNT has a diameter in the range of about 2 to 100 nm and is enveloped by a suitable insulating layer, such as by a thin insulating polymer layer or ceramic layer of about 5 to 500 nm thick over which a suitable conductor is applied in a thin layer (typically about 2 to 500 nm thick) which can be electrically connected to ground. A suitable electric contact is made with the CNT sensing element that is amplified and filtered if required to produce an output signal representing an extremely small sample area, for example less than 1 square micron or even less than 0.10 sq microns. The multiple layers of this sensor can be affixed onto a suitable support to provide rigidity and/or mechanical strength to the assembly. The support may alternatively contain integrated signal processing components or other electronics, such as an operational amplifier, a differential amplifier, a filter, or a readout device. The individual layers of the subject probe can be manufactured by a suitable gas or vapor phase deposition method generally known in the art, by metal electro-deposition either electroless or electrolytic, by combinations thereof or by any other suitable method or methods. Using the suggested manufacturing processes enable the aforedescribed small-size, multilayer devices to be mass produced and at low cost. Using this device and above-described methodology, it is envisioned that extremely small charge levels which occur over very small areas of a subject surface, for example less than 1 square micron in area and even less than 100 square nm at surface potentials below 1 millivolt per square micron which occur within a large charged surface, such as in an electrophotographic photoreceptor, can be detected and measured.

In embodiments where more than one sensing element (or at least two sensing elements) are used, it is important that the sensing elements be separated at at least a distance that causes little or no cross-interference or shorting to take place between the sensing elements when positioned in concert with a surface of interest. It is also important that a suitable insulating media be employed in the spaces that separate sensing electrodes and sensing and reference electrodes.

DETAILED DISCUSSION OF DRAWINGS AND PREFERRED EMBODIMENTS

Figure 1:
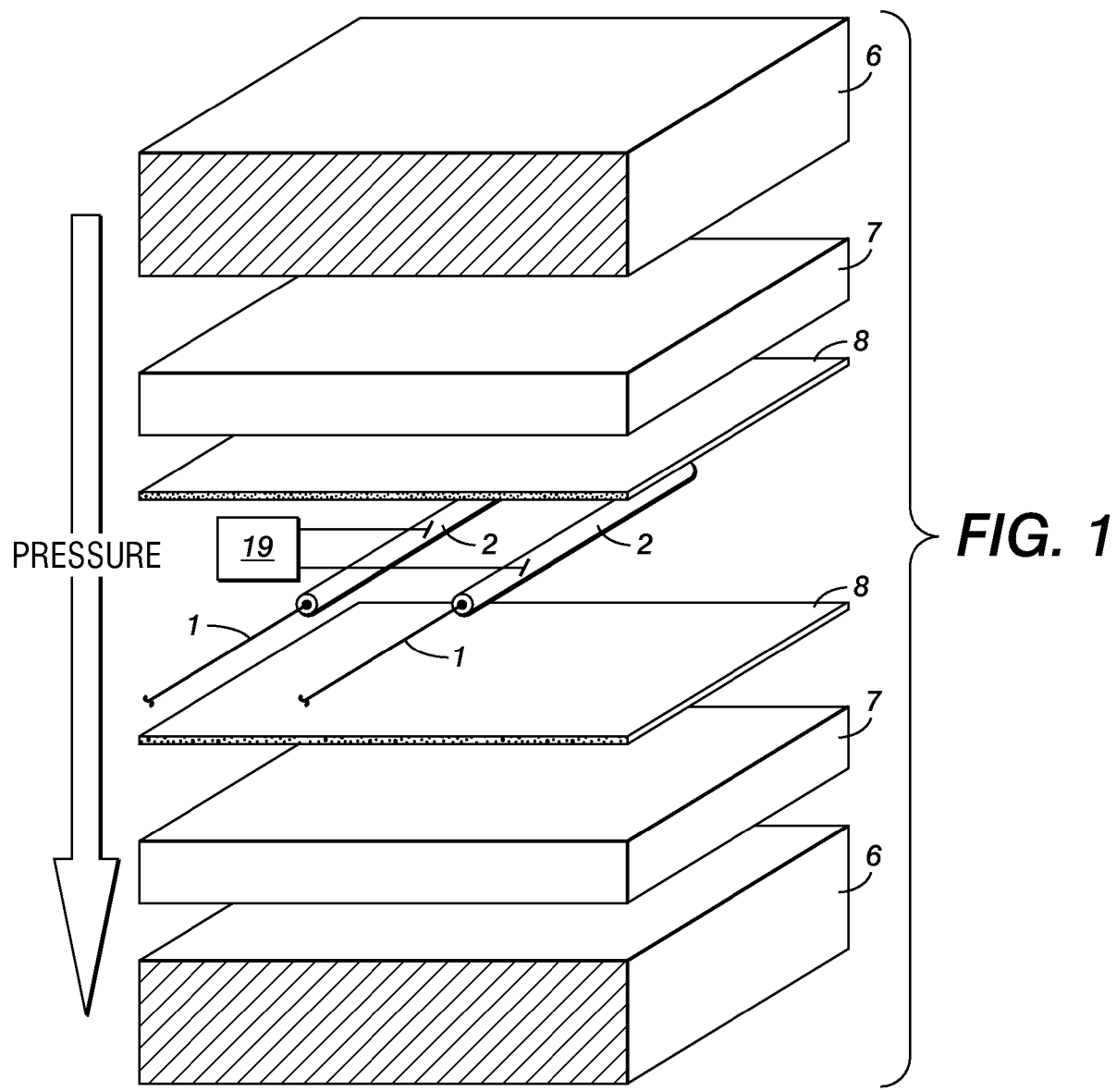
FIG. 1 is an exploded view of the components of an embodiment of the probe of this invention.
Figure 2:
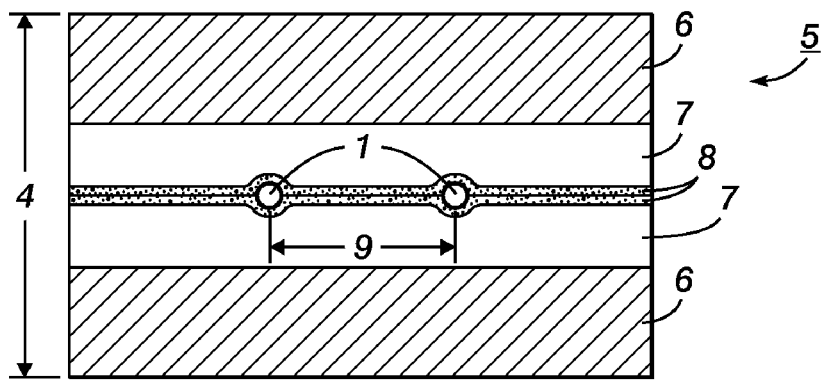
FIG. 2 is a front view of the assembled probe components shown in FIG. 1.
Figure 3:
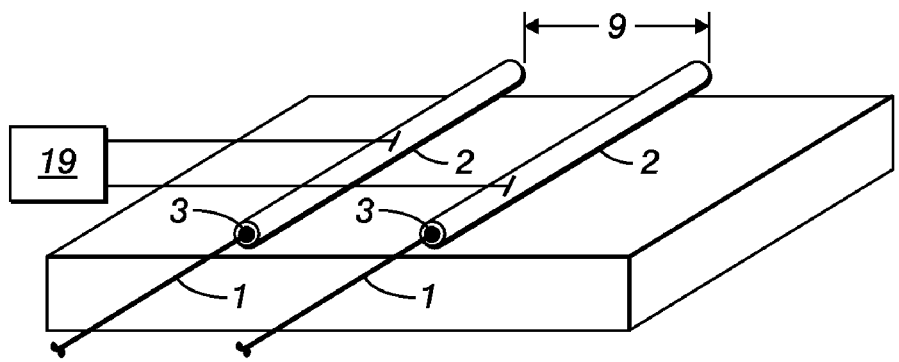
FIG. 3 is a top perspective view showing the attachment of the sensing elements to a wire that will extend and be connected to an electrometer.

FIG. 1 illustrates an exploded view of the components of an embodiment of the present probe. Shown in FIGS. 1-3 are two ten micrometer sensing elements or measurement electrodes 1 coupled to larger diameter hook up leads 2 (30 micrometer diameter tungsten wire in this example); see FIG. 3. These leads 2 are electromechanically connected to the sensing elements 1 by solder 3 or any other suitable means. The leads 2 are attached by any suitable method to any suitable read out device, such as an electrometer 19. The probe has electronic detection-resolution capabilities in the range of about 1 to 5 microns. The sensing elements 1 are assembled in close planar alignment and held rigidly within a multilayer sandwich configuration 4 (see FIG. 2) that comprises the high resolution probe 5. Pairings of the sensing elements 1 as shown in FIGS. 2 and 3 may be aligned having a separation distance 9 that is equal or nearly equal along the entire span of their lengths. Likewise, the separation distance between connecting leads 2 as shown in FIG. 2 may be equal or nearly equal along their entire span. Alternatively, the sensing elements and connecting wires may be positioned to have a non-uniform or a variable separation distance (not shown) at one or more points along their lengths. Referring to FIG. 2, the outermost layers of the sandwich 4 are made up of a suitable conductive plate material or reference electrode 6, for example, by thin aluminum sheets upon which a thin layer of a suitable dielectric film, foil, or tape layer 7 is layered, such as polyvinylchloride, polyester, Kapton®, or Teflon® that has, optionally, a pressure sensitive adhesive (PSA) 8 on one or both sides. Using the PSA 8, the sensing elements 1 are thereby adhesively bound to innermost sides of the insulating layers 7 or alternatively a thin layer of a suitable insulating adhesive (not shown) like fast curing epoxy may be used for this purpose. The outermost sides of the insulating layers 7 are secured onto the innermost sides of the conductive plates or reference electrodes 6 by a suitable insulating adhesive which may be a PSA 8 or by a suitable like fast curing epoxy adhesive, either of which is used to secure and solidify the multiple layers into a rigid sandwich unit 4 of FIG. 2. In addition, FIG. 2 shows the relative position and size of the sensing elements 1 within the multiple sandwich layers 4 of the probe 5. The distance 9 between the sensing elements 1 can be any suitable distance but in this embodiment and to enable easy manufacture the distance is greater than about 2 to 10 times the diameter of either sensor 1, as well as greater than the diameter of the support wires 2. This distance 9 can assure that little or no cross-interference takes place between the sensing elements 1. The maximum distance 9 between the sensing elements 1 is governed by several factors, which include such parameters as: the overall size of the device under test, the size of and distance between regions of interest on the target sample, the relative level of variation in the features of interest in the DUT, the size of the individual sensors 1, the size of the supporting interconnects 2, the presence of an insulating material such as an adhesive between the elements 1 and/or elements 2, the scan length capability of the probe 5, the rate of change of feature under examination in the subject area (for example, flickering), and/or the level of charge or surface potential being examined, etc. In practice the distance between the sensors 1 will be selected to be close to the minimum, as above described in order to achieve the greatest sensitivity. Furthermore, a suitable insulating media, such as an insulating adhesive, in general, will be used along and between the sensing elements 1 and the supporting interconnects 2 to provide rigid support to the innermost layers of assembly 5 and to minimize mechanical vibration or cross talk and electric shorting between the elements.

Figure 4:
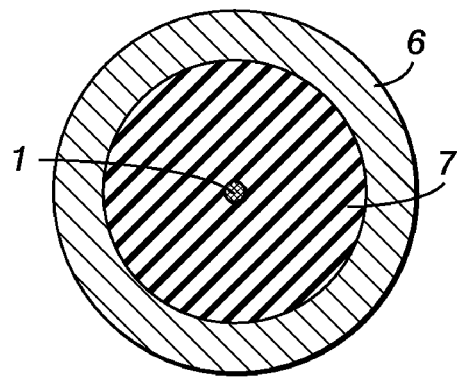
FIG. 4 shows an alternate co-axial, rod-in-tube-like configuration of an embodiment of the probe of this invention.

In FIG. 4 an alternative pipe-like or co-axial configuration of the field probe is illustrated. The five to ten micron sensing element 1 (for example made from a short length of a single carbon fiber that was extracted from a commercially available multifilament carbon fiber tow known as Hexcel AS 4 manufactured by the Hexcel Corp, Stamford, Conn., or equivalent) is used and is mounted in a central position within a conductive tube or reference electrode 6 having at least one conductive surface along its length. The thickness of the insulating material 7 used to electrically isolate the sensing element 1 from the surrounding metal 6 must be preferably between 2 to 10 times that of the diameter of the sensing element 1. This ensures that the non-tangent electric field lines from small local area potentials on the DUT going to the probe 5 are minimized, thereby enabling an accurate measurement of the charge on the surface or alternatively from the current being carried there between; see FIG. 5.

Figure 5:
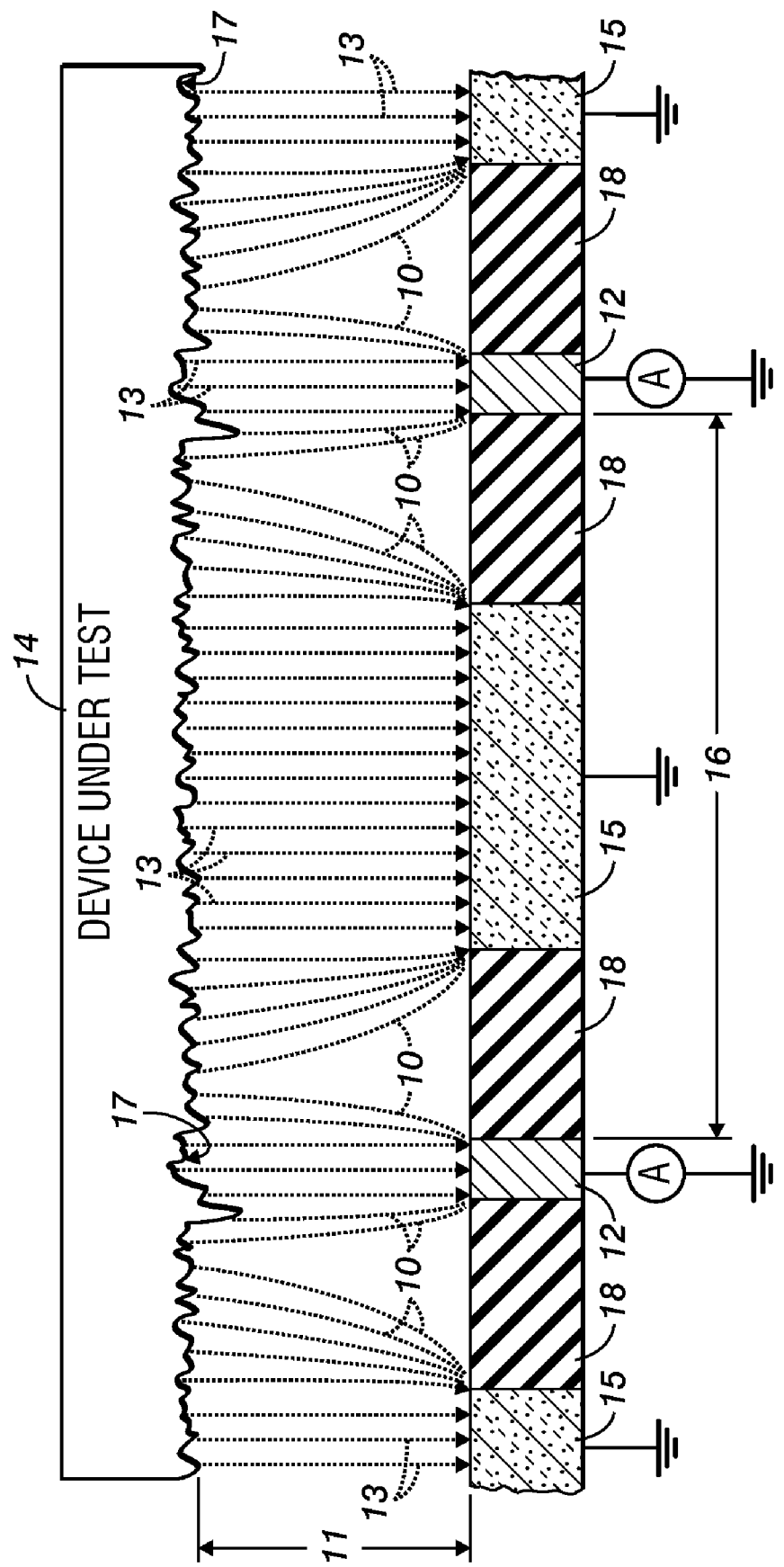
FIG. 5 illustrates the field lines of the electric field that are established by the surface potential difference that exist between the surfaces of the Device Under Test and the reference and sensing elements.
Figure 6A:
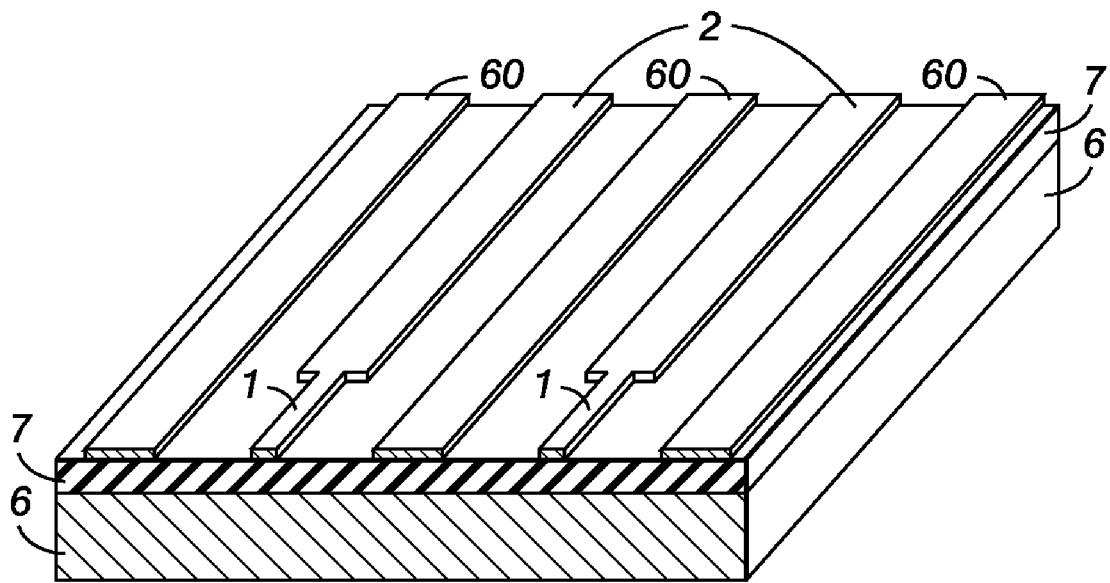
FIGS. 6a and 6b illustrate additional alternate configurations of the reference electrode including T-shaped rails.
Figure 6B:
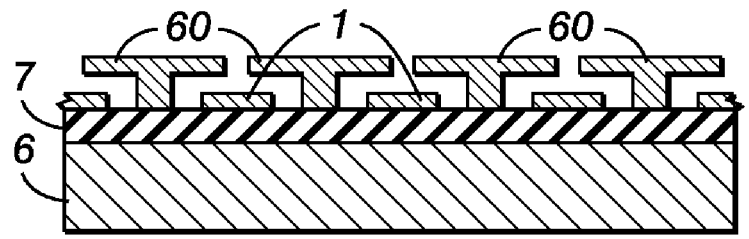

FIG. 5 illustrates the relationship amongst sensing elements or measurement electrodes 12 occurring in a plenary configuration and the electric field lines of the electrostatic field 10 and 13 created by the surface potential difference(s) that occurs between the DUT and the grounded reference plane 15, and between the DUT and the sensing elements 12 of the multi-element sensor 5 of FIG. 2. The objective of the device is to have little or no disturbance in the perpendicular pattern 13 of the field lines that span the air gap 11 between the DUT 14 and sensor 12. This assures that neither the presence of the sensors 12 themselves, identified as isolated electrodes in FIG. 5, within the local area under examination, nor any far field potentials do not adversely influence the accuracy or precision of the measurement. Shown in FIG. 5 is a practical and near ideal relationship of electrode widths 12, insulator 18 widths, inter-sensing electrode spacings 16, and surrounding reference electrodes 15 that enables the device design objective to be achieved. Shown in FIGS. 6a and 6b are additional shapes of the sensing and reference electrodes. In embodiments, thin conductor layers such as a metal, metal oxide, conductive polymer, conductive composite, etc. for example of copper, silver, gold, platinum, tin oxide, carbon nanotube filled polyimide, and the like can be applied in a pattern by deposition, lamination, or any other suitable means to create the pattern of parallel, separated lines shown in FIG.

6a. Sensor elements 1 in FIG. 6a are shown as thin rectangular elements layered upon a supporting substrate comprising a suitable insulating layer 7 on metal plate configuration 6. Slightly behind the sensing elements 1, the width of the conductors 2 that serve as interconnects between the sensing elements and external circuitry (not shown) can be somewhat wider as may be required to mate with the external interface(s). Reference electrodes 60 are made from similar materials and layered upon the substrate by similar process to lay parallel and appropriately separated from the sensing elements. Alternately, the reference electrodes 60 can take on any suitable shape including those illustrated in FIG. 6b where "T-shaped" rails are used to partially envelop the sensing electrodes 1. In so doing, the top surfaces of the rails of FIG. 6b may comprise a continuous reference surface at the topside of the sensors and thereby form the uppermost layer of the multilayer device of FIGS. 1 and 2. In all embodiments of the probe herein described, the reference electrodes may be in the form of any suitable configuration including a tube, a pipe, a plate, a shell, a rail, a line and mixtures thereof. When reference is made to a "suitable configuration" for the reference electrode, these forms are included. The sensing elements are either uniform or non-uniform in width or diameter along the length of the element. Most importantly, referring to FIG. 5, the non-tangent electric field lines 10 from the DUT 14 going to electrode are minimized, thereby enabling an accurate measurement of, for example, the current being produced and/or field geometries being affected by non-uniformly distributed surface charges on the subject surface 17 or other features, such as hot spots on an electron emitter surface.

The surrounding grounded material 6 of the device of FIGS. 1, 2, 4 and 6 can be made from any conductive material, including metals, metal alloys, conductive plastics and the like. The insulating material 7 can be any suitable insulator including gasses, glass, silica, ceramic, certain metal oxides, polymers including elastomers, or rigid plastic sheets. Alternatively a thin, flexible polymeric film, such as polyester (Mylar), polyimide (Kapton), polyethylene, silicone, Teflon and the like can be used. The insulator can be of any suitable form such as a continuous or discontinuous solid, gas, or vacuum. Alternatively, a suitable vacuum can be created and sealed between the electrodes 1 and 6 of FIG. 4 thereby eliminating air and serving as an insulating layer. The isolated electrodes or measurement electrodes 1 can be very fine wire, rod, tube, or conductive fiber that can be uniform in dimension or tapered or otherwise non-uniform in dimension and may or may not be coated with a metal in order to make handling or solder or adhesive attachment easier. One of the prototypes used to test the operability of the inventive device was made using two thin plates 6 of aluminum of about 1 mm in thickness. A strip of polyimide (Kapton) tape 7 was attached to the innermost surfaces of each of the plates 6, See FIG. 1, to provide an insulating interface to isolate the electrode 1 from contact with the reference element 6. The electrodes 1 consisted of two eight micron carbon fibers (Hexcel AS 4) that had been nickel coated by metal vapor deposition. The nickel coating gave the fibers a degree of rigidity that made it easier to handle than the uncoated fiber. Importantly, the nickel layer on the carbon fibers also enabled them to be easily soldered onto the larger 30 micron diameter supporting wires 2 of this assembly. Each fiber sensing element was placed at the desired location and spacing on the Kapton tape having pressure sensitive adhesive which was mounted on one of the aluminum plates, and the other plate having similar layer of PSA backed Kapton tape was aligned and placed on top of it to form a sandwich 4 around the electrode 1. In addition, insulating epoxy 8 (commercial grade 5 minute curing epoxy) was used to secure the two plates 6 with the various layers together and to ensure there was no air gaps between the electrodes 1 and between the electrodes and the Kapton. A slight pressure was applied to the assembly while it was allowed time to cure the epoxy adhesive layers. Once the epoxy 8 had hardened, the assembly was placed in a conventional dicing saw of the type typically used to cut integrated circuit elements from a silicon wafer and a cut was made using a diamond cutting wheel to create a smooth surface across the entire face as shown in FIG. 2. This process of fabrication ensured that the faces of the exposed ends of the fiber electrodes 1 were flush with each other and with the surrounding aluminum reference elements 6. Given that, in this embodiment, two identical sensing elements 1 are mounted in a co-planar arrangement of a scanning probe, two nearly identical output signals can be extracted from the device. The two signals are identical in every respect except for a constant spatial (and thereby a temporal) displacement. This unique arrangement of elements presents two opportunities for signal processing. The first is simply to capture and record the duplicate, individual signals and use one to replicate and validate the other. Clearly, should a malfunction occur in one of the signals for whatever reason, the experimental quality would not be compromised because at least one useable and valid signal would result. This is viewed to be an important feature of this proposed device.

Alternately, the individual signals could be coupled to a microelectronic differential operational amplifier whose purpose would be to receive the signals produced by each sensor, calculate a differential between the signal levels and produce a single output signal that represents a comparison of positional, temporal, and/or amplitudinal parameters of interest. The output of the differential comparator electronic device can be amplified (by a solid state operational amplifier) to produce the level of signal as needed to be displayed on a contemporary meter device, such as an electrometer. A further option is to use the signal that is acquired by the first sensor that is scanned over a region of interest of a DUT and use this signal to feed and control the bias either on the second sensing element being scanned over the same region or on the reference element on the second sensing unit. Use of the first as a feedback to control the second enables the steady state potential difference between the DUT's surface and the multi-element sensing device to be close to nil. Any disruption of this zero-difference steady state condition can be easily sensed and amplified as appropriate to enable one to focus on and to precisely pin-point where the variation is occurring on the DUT's surface. Optionally, this pin-pointed region can be rescanned to acquire or map additional detail relating to its features.

It is proposed that this invention will offer an effective way to characterize microscopic features in operating charging devices that are under development for future products, as well as in other valuable applications, such as, for example, manufacturing quality control. There is a large, highly competitive industry that services the xerographic cartridge remanufacturing market and related after market sectors. Within this industry are companies that provide equipment to characterize xerographic components. This invention could easily be adopted by companies who develop and sell equipment for cartridge remanufactures to characterize various functional attributes of a variety of xerographic components. It's likely that this invention could be used by many to ensure and/or guarantee that a charge device is providing acceptable charging uniformity before putting the device into the final xerographic assembly. Thus, the need to print test the cartridge before shipping to the customer would be avoided thereby saving time and money. Additionally, remanufacturing companies could use this probe device during development of replacement components for OEM cartridges to ensure equivalent performance of the OEM components.

Noteworthy is the fact that the devices themselves can be very small and compact which will enable their use as well as their likely multiple uses in confined or densely packed areas of a larger product such as a printer. Their multilayer, integrated design assures that they can be robust to handling, environmental, or shipping damage. Further, the mass manufacture of these devices is shown herein to be straightforward thereby resulting in a unit manufacturing cost for the sensor that can be low. It is envisioned, therefore, that a vast number of these probes could be used in the various laboratories to provide better insights into the xerographic processes under development and to significantly reduce the development time and resources typically required Likewise, the high resolution feature of these devices could be imbedded as a process sensor within many printer products and used as a basis for a sophisticated sense and monitor system.

It will be appreciated that various aspects of the above-disclosed and other features and functions, or alternatives thereof, may be desirably combined into many other different systems or applications. Also, that various presently unforeseen or unanticipated alternative, modifications, variations or improvements therein may be subsequently made by those skilled in the art which are also intended to be encompassed by the following claims:

What is claimed is:

1. A high resolution multifunctional electronic scanning field probe comprising: reference electrodes, at least two sensing elements in close distance or proximity to each other separated in a single mounting, a cross sectional dimension of said sensing elements are micron sized or sub-micron sized, said sub-micron sized sensing elements are enabled to have or achieve greatest resolution capabilities, said sensing elements aligned to move in tandem and in substantially a same path during scanning of a sample of interest, said resolution capabilities in the range of about 1 to 100 nm; said sensing elements operationally connected to an electrometer for a read-out of probe results, said sensing elements at least substantially surrounded by suitably configured reference electrodes, said distance between said sensing elements being at least two (2) times the diameter of said sensing elements, said suitably configured reference electrodes includes of a form selected from the group consisting of a tube, a pipe, a plate, a rail, and mixtures thereof, each said sensing element is so placed to eliminate distortion or cross talk between said sensing elements.

2. The probe of claim 1 having electronic detection-resolution capabilities in the range of 1 to 1000 microns.

3. The probe of claim 1 wherein said reference electrodes that substantially surround said measurement electrodes are in the form of conductive plates, resulting in a probe sandwich configuration with said measurement electrodes between said plates.

4. The probe of claim 1 wherein for each sensing element there is at least one reference electrode.

5. The probe of claim 1 enabled to be used to measure charge of a photoconductive layer in an electrophotographic marking system.

6. The probe of claim 1 enabled to be used to measure charge on an intermediate transfer belt or roll, a fuser or pressure roll, or a moving surface in an electrophotographic marking system.

* * * * *